(12) United States Patent
Goswami

(10) Patent No.: US 8,698,173 B2
(45) Date of Patent: Apr. 15, 2014

(54) SOLID STATE LIGHTING DEVICES WITH SEMI-POLAR FACETS AND ASSOCIATED METHODS OF MANUFACTURING

(71) Applicant: Micron Technology, Inc., Boise, ID (US)

(72) Inventor: Jaydeb Goswami, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/758,401

(22) Filed: Feb. 4, 2013

(65) Prior Publication Data

US 2013/0214248 A1    Aug. 22, 2013

Related U.S. Application Data

(62) Division of application No. 12/819,672, filed on Jun. 21, 2010, now Pat. No. 8,372,671.

(51) Int. Cl.
*H01L 33/16* (2010.01)

(52) U.S. Cl.
USPC ............. 257/95; 257/103; 257/200; 257/628; 257/E33.006

(58) Field of Classification Search
USPC .................................... 438/41, 481
See application file for complete search history.

(56) References Cited

U.S. PATENT DOCUMENTS

| | | | |
|---|---|---|---|
| 6,635,901 B2 | 10/2003 | Sawaki et al. | |
| 6,969,670 B2 | 11/2005 | Biwa et al. | |
| 8,008,170 B2 | 8/2011 | Liang et al. | |
| 8,294,171 B2 * | 10/2012 | Seo et al. | 257/98 |
| 2005/0093099 A1 | 5/2005 | Koike et al. | |
| 2006/0054929 A1 | 3/2006 | Nakayama et al. | |
| 2007/0205407 A1 | 9/2007 | Matsuo et al. | |
| 2009/0039361 A1 | 2/2009 | Li et al. | |
| 2009/0098343 A1 | 4/2009 | Arena et al. | |
| 2010/0025656 A1 | 2/2010 | Raring et al. | |
| 2011/0121330 A1 * | 5/2011 | Tak et al. | 257/94 |
| 2011/0309324 A1 | 12/2011 | Goswami | |

OTHER PUBLICATIONS

Feezell, D.F. et al., Development of Nonpolar and Semipolar InGaN/GaN Visible Light-Emitting Diodes, MRS Bulletin, vol. 34, pp. 318-323, May 2009.
Ni, X. et al., Nonpolar m-plane GaN on patterned Si(112) substrates by metalorganic chemicla vapor deposition, Applied Physics Letters 95, 111102-1 (2009).

* cited by examiner

*Primary Examiner* — Stephen W Smoot
(74) *Attorney, Agent, or Firm* — Perkins Coie LLP

(57) ABSTRACT

Solid state lighting devices with semi-polar or non-polar surfaces and associated methods of manufacturing are disclosed herein. In one embodiment, a solid state lighting device includes a substrate material having a substrate surface and an epitaxial silicon structure in direct contact with the substrate surface. The epitaxial silicon structure has a sidewall extending away from the substrate surface. The solid state lighting device also includes a semiconductor material on at least a portion of the sidewall of the epitaxial silicon structure. The semiconductor material has a semiconductor surface that is spaced apart from the substrate surface and is located on a semi-polar or non-polar crystal plane of the semiconductor material.

15 Claims, 8 Drawing Sheets

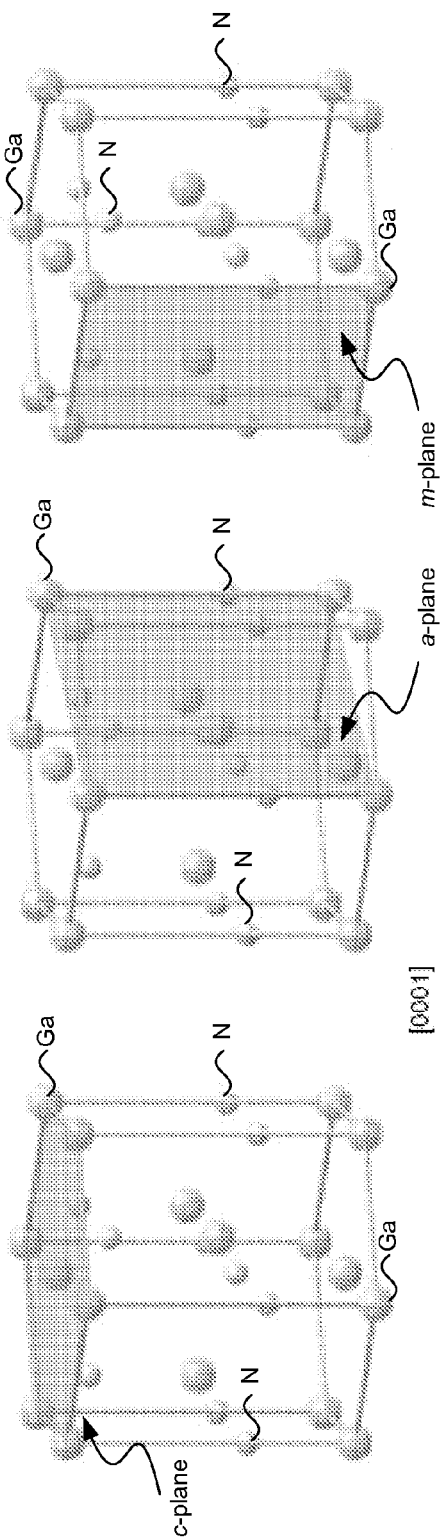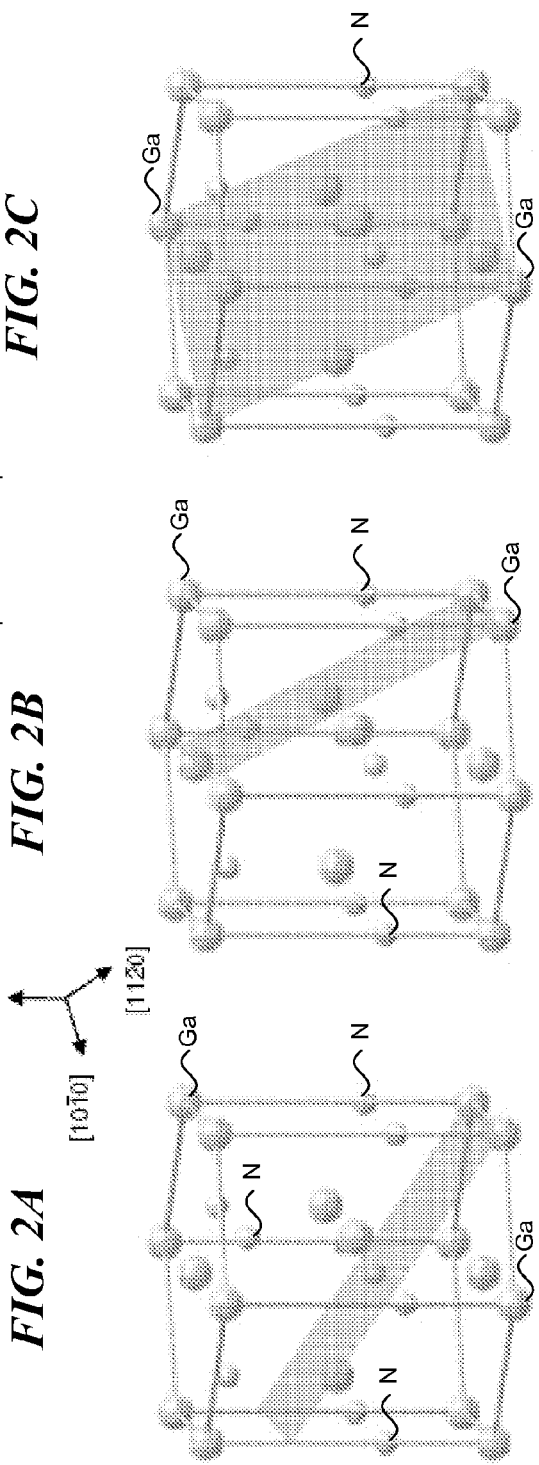

US 8,698,173 B2

SOLID STATE LIGHTING DEVICES WITH SEMI-POLAR FACETS AND ASSOCIATED METHODS OF MANUFACTURING

CROSS-REFERENCE TO RELATED APPLICATION

This application is a divisional of U.S. application Ser. No. 12/819,672 filed Jun. 21, 2010, now U.S. Pat. No. 8,372,671, which is incorporated herein by reference.

TECHNICAL FIELD

The present technology is directed generally to solid state lighting ("SSL") devices with semi-polar or non-polar crystalline facets and associated methods of manufacturing.

BACKGROUND

SSL devices generally use semiconductor light emitting diodes ("LEDs"), organic light emitting diodes ("OLEDs"), laser diodes ("LDs"), and/or polymer light emitting diodes ("PLEDs") as sources of illumination rather than electrical filaments, a plasma, or a gas. FIG. 1 is a cross-sectional diagram of a portion of a conventional indium-gallium nitride ("InGaN") LED 10. As shown in FIG. 1, the LED 10 includes a substrate 12 (e.g., silicon carbide, sapphire, gallium nitride, or silicon), an N-type gallium nitride ("GaN") material 14, a GaN/InGaN multi quantum well ("MQW") 16, and a P-type GaN material 18 on top of one another in series. The LED 10 also includes a first contact 20 on the P-type GaN material 18 and a second contact 22 on the N-type GaN material 14.

The GaN/InGaN materials of the LED 10 have a wurtzite crystal formation in which hexagonal rings of gallium (or indium) are stacked on top of hexagonal rings of nitrogen atoms. According to conventional techniques, the GaN/InGaN materials are typically grown on silicon wafers with the Si(1,1,1) crystal orientation. The GaN/InGaN materials are thus grown along a direction generally perpendicular to the hexagonal rings of gallium (or indium) and nitrogen atoms. As discussed in more detail later, the growth direction of the GaN/InGaN materials may negatively impact the optical efficiency of the LED 10. Also, silicon wafers with the Si(1,1,1) crystal orientation can be expensive to produce because conventional production techniques typically yield the Si(1,0,0) crystal orientation. Thus, chemical, thermal, and/or other types of additional processing may be required to expose and/or otherwise provide the Si(1,1,1) crystal facets. Accordingly, several improvements in increasing the optical efficiency while reducing the manufacturing costs of LEDs may be desirable.

BRIEF DESCRIPTION OF THE DRAWINGS

FIGS. 2A-2F are schematic perspective views of various crystal planes in a GaN/InGaN material in accordance with embodiments of the technology.

DETAILED DESCRIPTION

Figure 1:
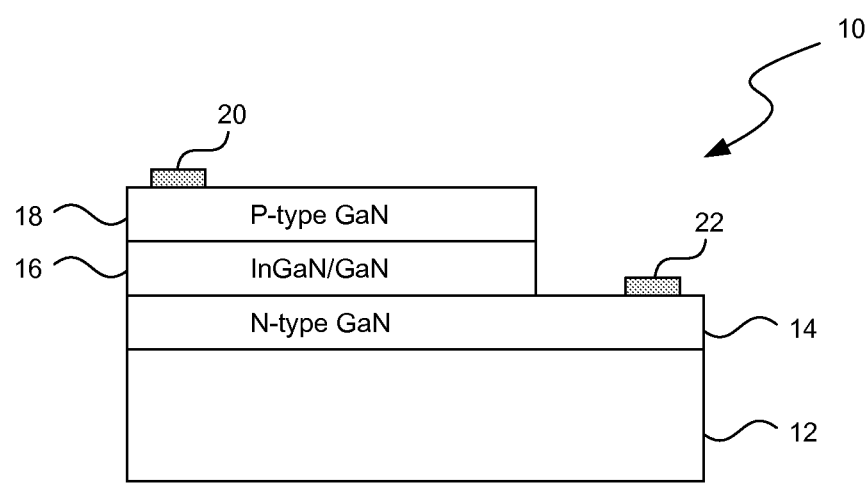
FIG. 1 is a cross-sectional view of a portion of an LED in accordance with the prior art.

Various embodiments of SSL devices and associated methods of manufacturing are described below. The term "microelectronic substrate" is used throughout to include substrates upon which and/or in which SSL devices, microelectronic devices, micromechanical devices, data storage elements, read/write components, and other features are fabricated. The term "optical efficiency" is defined as a percentage of photon output per unit electron input. A person skilled in the relevant art will also understand that the technology may have additional embodiments, and that the technology may be practiced without several of the details of the embodiments described below with reference to FIGS. 2A-5C.

In the following discussion, an LED having GaN/InGaN materials is used as an example of an SSL device in accordance with embodiments of the technology. Several embodiments of the SSL device may also include an LED and/or a laser diode ("LD") having at least one of gallium arsenide (GaAs), aluminum gallium arsenide (AlGaAs), gallium arsenide phosphide (GaAsP), aluminum gallium indium phosphide (AlGaInP), gallium(III) phosphide (GaP), zinc selenide (ZnSe), boron nitride (BN), aluminum nitride (AlN), aluminum gallium nitride (AlGaN), aluminum gallium indium nitride (AlGaInN), and/or other suitable semiconductor materials. The foregoing semiconductor materials may have generally similar or different crystal structures than GaN/InGaN materials. However, the following definitions of polar, non-polar, and semi-polar planes may still apply.

FIGS. 2A-2F are schematic perspective views of various crystal planes in a portion of a GaN/InGaN material. In FIGS. 2A-2F, Ga (or Ga/In) and N atoms are schematically shown as large and small spheres, respectively. As shown in FIGS. 2A-2F, the GaN/InGaN material has a wurtzite crystal structure with various lattice planes or facets as represented by corresponding Miller indices. A discussion of the Miller index can be found in the *Handbook of Semiconductor Silicon Technology* by William C. O'Mara.

As used hereinafter, a "polar plane" generally refers to a crystal plane in a crystal structure that contains only one type of atoms. For example, as shown in FIG. 2A, the polar plane denoted as the "c-plane" in the wurtzite crystal structure with a Miller index of (0001) contains only gallium atoms. Similarly, other polar planes in the wurtzite crystal structure may contain only nitrogen atoms and/or other suitable type of atoms.

As used hereinafter, a "non-polar plane" generally refers to a crystal plane in a crystal structure that is generally perpendicular to a polar plane (e.g., to the c-plane). For example, FIG. 2B shows a non-polar plane denoted as the "a-plane" in the wurtzite crystal structure with a Miller index of (11$\bar{2}$0). FIG. 2C shows another non-polar plane denoted as the "m-plane" in the wurtzite crystal structure with a Miller index of (10$\bar{1}$0). Both the a-plane and the m-plane are generally perpendicular to the c-plane shown in FIG. 2A.

As used hereinafter, a "semi-polar plane" generally refers to a crystal plane in a crystal structure that is canted relative to a polar plane (e.g., to the c-plane) without being perpendicular to the polar plane. For example, as shown in FIGS. 2D-2F, each of the semi-polar planes in the wurtzite crystal structure with Miller indices of (10$\bar{1}$3), (10$\bar{1}$1), and (11$\bar{2}$2) form an angle with the c-plane shown in FIG. 2A. The angle is greater than 0° but less than 90°. Even though only particular examples of crystal planes are illustrated in FIGS. 2A-2F, each of the polar, non-polar, and semi-polar planes can also include other crystal planes not illustrated in FIGS. 2A-2F.

FIGS. 3A-3I are cross-sectional and top views of a portion of a microelectronic substrate 100 undergoing a process of forming an SSL device in accordance with embodiments of the technology. Even though only certain processing stages are illustrated in FIGS. 3A-3I, the process of forming the SSL device can also include other stages for forming a lens, a mirror material, a support structure, conductive interconnects, and/or other suitable mechanical/electrical components (not shown).

Figure 3A:
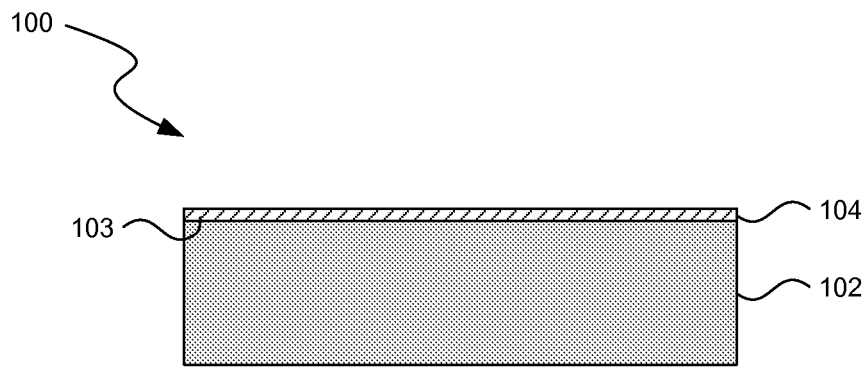
FIGS. 3A-3K are cross-sectional and top views of a portion of a microelectronic substrate undergoing a process of forming an SSL device in accordance with embodiments of the technology.

As shown in FIG. 3A, an initial stage of the process can include forming a masking material 104 on a substrate surface 103 of a substrate material 102. In one embodiment, the substrate material 102 can include silicon (Si), at least a portion of which has the Si(1,0,0) crystal orientation at the substrate surface 103. In other embodiments, the substrate material 102 can include silicon with other crystal orientations (e.g., Si(1,1,1)), AlGaN, GaN, silicon carbide (SiC), sapphire ($Al_2O_3$), a combination of the foregoing materials and/or other suitable substrate materials.

In one embodiment, the masking material 104 includes silicon nitride (SiN), which may be deposited onto the substrate material 102 via chemical vapor deposition ("CVD"), atomic layer deposition ("ALD"), and/or other suitable techniques. In other embodiments, the masking material 104 can include silicon dioxide ($SiO_2$), which may be formed on the substrate material via CVD, ALD, thermal oxidation, and/or other suitable techniques. In further embodiments, the masking material 104 can include a photoresist and/or other suitable masking compositions. The masking material 104 can have a thickness of about 50 to about 100 Angstroms or other suitable thicknesses.

Figure 3B:
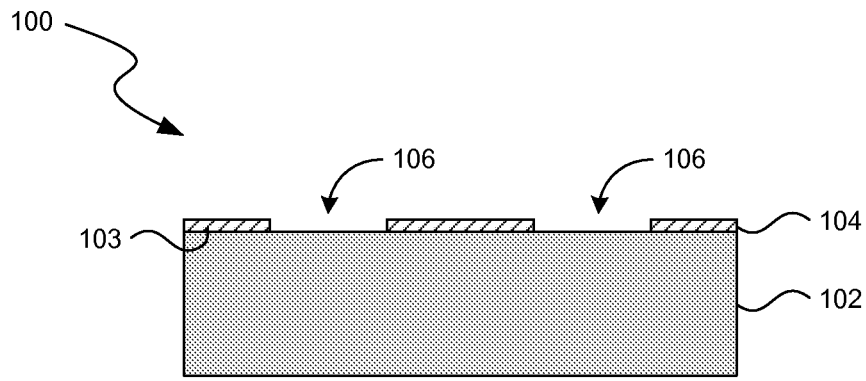
Figure 3C:
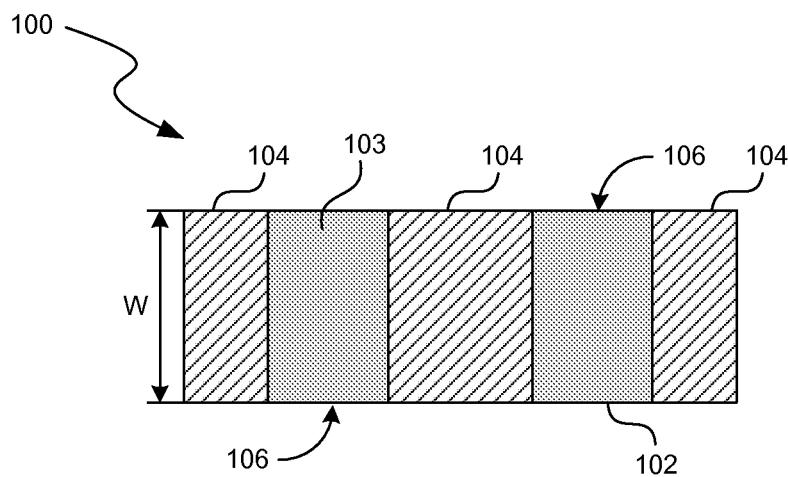

FIGS. 3B and 3C are cross-sectional and top views of the microelectronic substrate 100, respectively, during another stage of the process, in which a plurality of first openings 106 are formed in the masking material 104. The individual first openings 106 expose a portion of the substrate surface 103 of the substrate material 102. As shown in FIG. 3C, in the illustrated embodiment, the first openings 106 individually include a channel extending along the full width W of the substrate material 102. In other embodiments, the first openings 106 can be one or more slots (not shown) that individually extend along only a portion of the width W. In further embodiments, the first openings 106 can be apertures and/or other suitable shapes. The channels, slots, apertures, and/or other suitable openings can have a rectangular, a trapezoidal, parabolic, semicircular, or other suitably shaped cross sections.

In one embodiment, forming the first openings 106 can include depositing a photoresist (not shown) on the masking material 104, patterning the photoresist via photolithography to define the first openings 106, and removing a portion of the masking material 104 via wet etching, dry etching, laser ablation, and/or other suitable techniques. In another embodiment, the masking material 104 can include a photoresist, and forming the first openings 106 can include photo patterning the masking material 104 itself based on the desired first openings 106. In further embodiments, the first openings 106 may be formed via other suitable techniques.

Figure 3D:
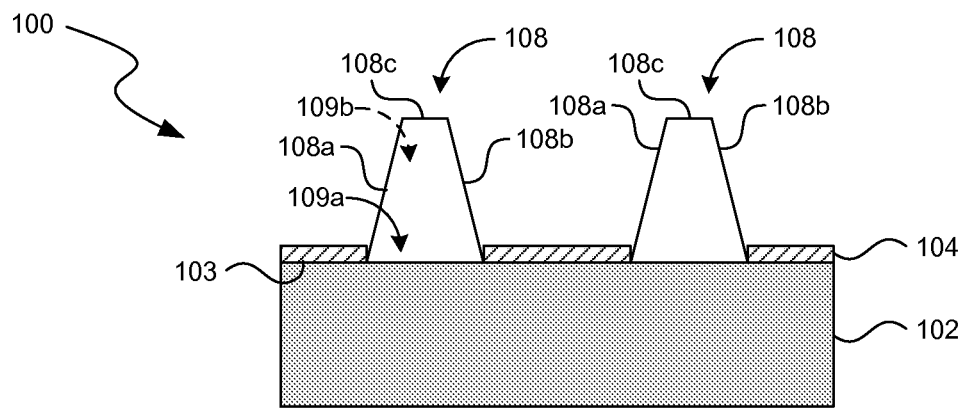
Figure 3E:
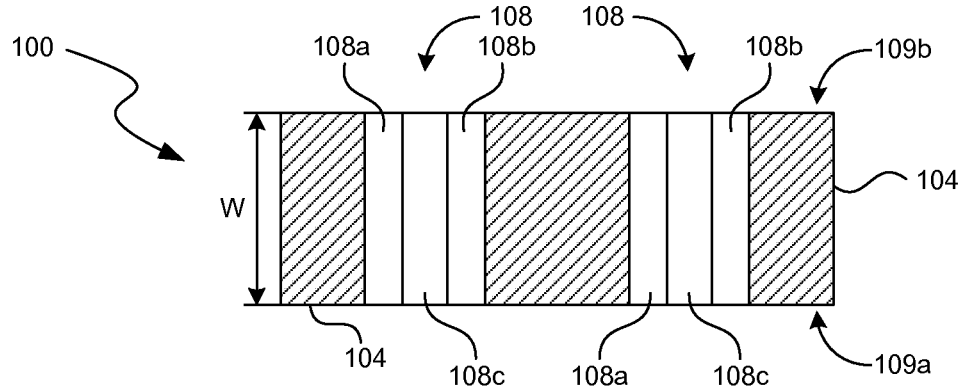

FIGS. 3D and 3E are cross-sectional and top views of the microelectronic substrate 100, respectively, during another stage of the process, in which epitaxial silicon structures 108 are formed on the substrate material 102 in the first openings 106. Suitable techniques for forming the epitaxial silicon structures 108 can include CVD, ALD, and/or other suitable techniques. As shown in FIGS. 3D and 3E, the individual epitaxial silicon structures 108 include a first sidewall 108a, a second sidewall 108b, and a top wall 108c all extending between first and second ends 109a and 109b. The first and second sidewalls 108a and 108b extend away from the substrate surface 103 of the substrate material 102 and terminate at the top wall 108c. The first and second ends 109a and 109b have a generally trapezoidal shape.

The inventor has observed that the first and second sidewalls 108a and 108b of the epitaxial silicon structures 108 have the Si(1,1,1) crystal orientation while the top wall 108c has the Si(1,0,0) crystal orientation when silicon is deposited via epitaxial growth. Without being bound by theory, it is believed that the Si(1,1,1) crystal orientation would result in lower surface energy for the deposited silicon when compared to other crystal orientations. As a result, the deposited silicon atoms tend to grow along the Si(1,1,1) crystal orientation to form the first and second sidewalls 108a and 108b as shown in FIG. 3D.

Even though the epitaxial silicon structures 108 shown in FIG. 3D have trapezoidal cross sections, in certain embodiments, the epitaxial silicon structures 108 can have a triangular cross section (not shown). The first and second sidewalls 108a and 108b can extend away from the substrate surface 103 of the substrate material 102 and terminate at an apex (not shown). In one embodiment, forming epitaxial silicon structures 108 with triangular cross sections can include increasing a deposition duration and/or adjusting other suitable deposition parameters. In further embodiments, the epitaxial silicon structures 108 can have a hexagonal pyramid shape and/or other suitable geometric shapes.

Figure 3F:
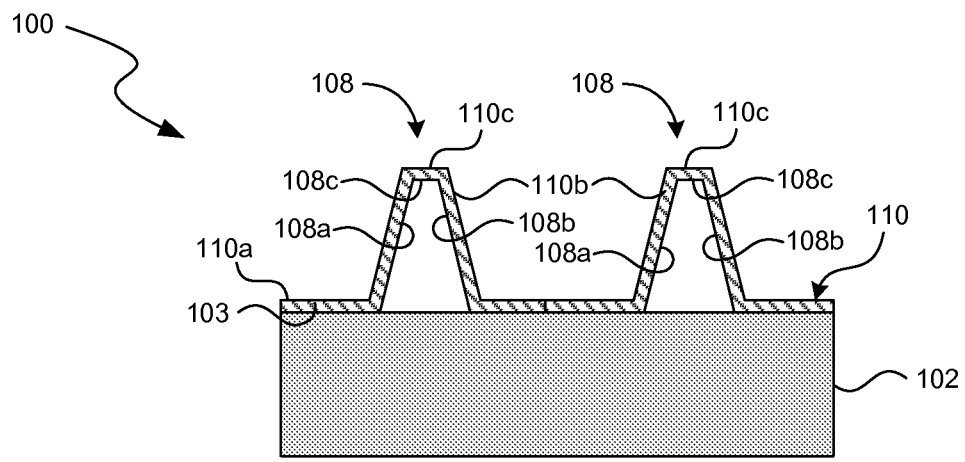

FIG. 3F shows an optional stage of the process, in which a buffer material 110 is formed on the epitaxial silicon structures 108 and the substrate surface 103 of the substrate material 102. As shown in FIG. 3F, the buffer material 110 can conform generally to the substrate surface 103 of the substrate material 102 and the epitaxial silicon structures 108. The buffer material 110 can include a first portion 110a on the substrate surface 103 of the substrate material 102, a second portion 110b on the first and second sidewalls 108a and 108b of the epitaxial silicon structures 108, and a third portion 110c on the top wall 108c of the epitaxial silicon structures 108. The buffer material 110 can include aluminum nitride (AlN), aluminum-gallium nitride (AlGaN), zinc nitride (ZnN), and/or other suitable materials formed via metal-organic CVD ("MOCVD"), molecular beam epitaxy ("MBE"), liquid phase epitaxy ("LPE"), hydride vapor phase epitaxy ("HVPE"), and/or other suitable techniques. In further embodiments, the buffer material 110 may be omitted.

Figure 3G:
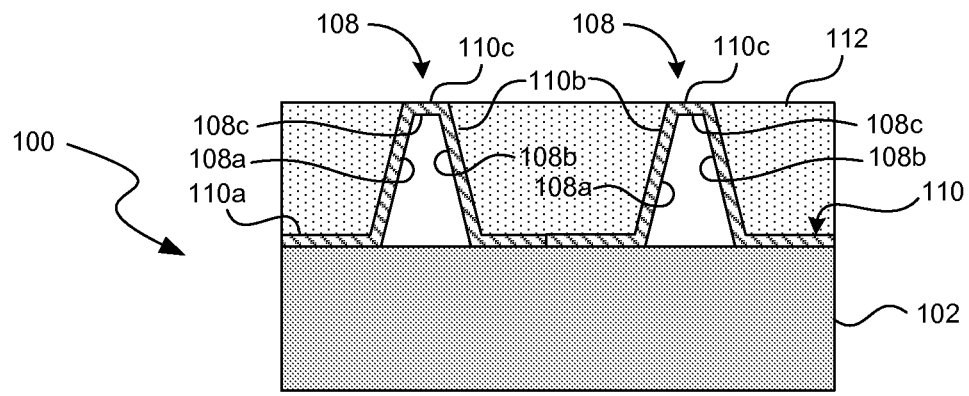

FIG. 3G shows another stage of the process in which an insulating material 112 is formed on the substrate material 102 with the optional buffer material 110. The insulating material 112 can include silicon nitride (SiN), silicon dioxide ($SiO_2$) and/or other suitable materials deposited via CVD, ALD, spin-on-dielectrics, and/or other suitable techniques. In the illustrated embodiment, the insulating material 112 substantially encapsulates the first and second portions 110a and 110b of the optional buffer material 110. The third portion 110c of the optional buffer material 110, however, is exposed through the insulating material 112. In other embodiments, the insulating material 112 may also cover the third portion 110c of the optional buffer material and completely encapsulate the first, second, and third portions 110a-110c of the optional buffer material 110 and the epitaxial silicon structures 108.

Figure 3H:
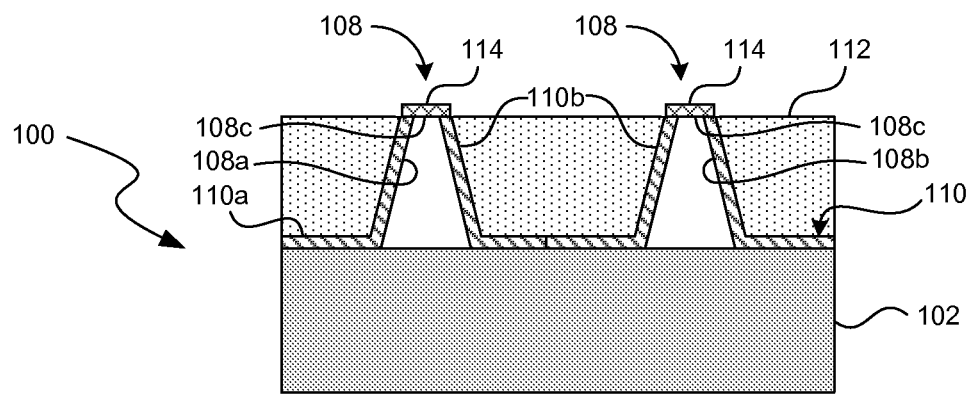

FIG. 3H shows another stage of the process, in which at least the third portion 110c of the optional buffer material 110 is removed. In one embodiment, removing the third portion 110c of the optional buffer material 110 can include polishing the microelectronic substrate 100 via chemical-mechanical polishing (CMP), electrochemical-mechanical polishing (ECMP), and/or other suitable polishing techniques. The polishing operation can terminate at the top wall 108c of the epitaxial silicon structures 108, or the process can continue to remove a portion of the epitaxial silicon structures 108. In another embodiment, the third portion 110c of the optional buffer material 110 shown in FIG. 3G may be removed via wet etching, dry etching, and/or other suitable techniques.

As shown in FIG. 3H, the process also includes forming a barrier material 114 on the top wall 108c of the epitaxial silicon structures 108. The barrier material 114 can have a generally similar composition or a different composition than that of the insulating material 112. In one embodiment, the barrier material 114 can include silicon dioxide ($SiO_2$) formed via thermal oxidation. In other embodiments, the barrier material 114 can also include other suitable materials formed via CVD, ALD, and/or other suitable techniques.

Figure 3I:
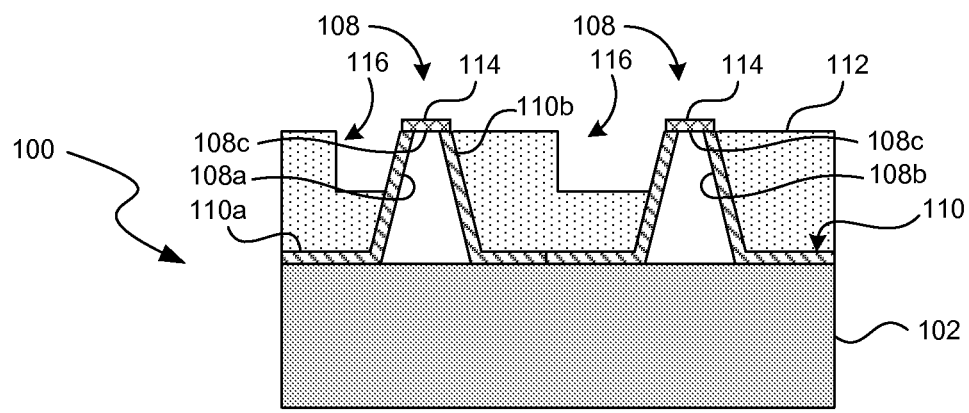

FIG. 3I shows another stage of the process, in which a portion of the insulating material 112 is removed to form second openings 116 that expose at least parts of the second portion 110b of the optional buffer material 110. The exposed parts of the second portion 110b all have the same crystal orientation (e.g., generally similar to Si(1,1,1)). In one embodiment, removing a portion of the insulating material 112 includes depositing a photoresist (not shown) on the insulating material 112, patterning the photoresist to define the second openings 116, and removing a portion of the insulating material 112 to form the second openings 116. In other embodiments, the second openings 116 may be formed via other suitable techniques.

Figure 3J:
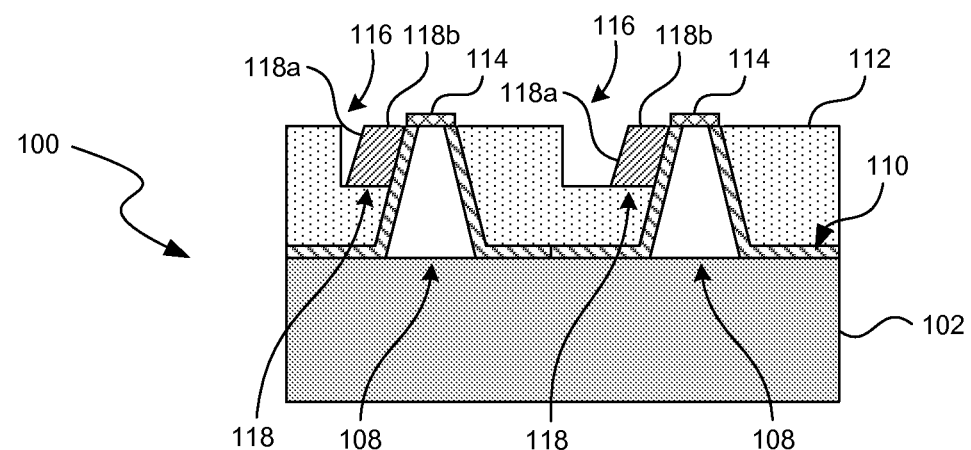
Figure 3K:
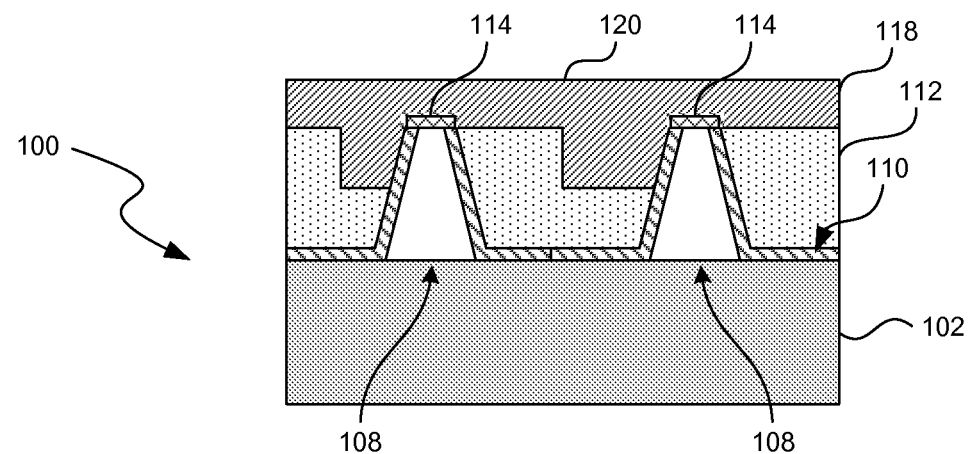

FIGS. 3J-3K show another stage of the process, in which a semiconductor material 118 is deposited over the first or second sidewalls 108a and 108b of the epitaxial silicon structures 108. In the illustrated embodiment, the semiconductor material 118 includes N-type GaN. In other embodiments, the semiconductor material 118 can include P-type GaN, InGaN, GaN/InGaN MQWs, and/or other suitable semiconductor materials deposited via MOCVD, MBE, LPE, HYPE, and/or other suitable techniques.

FIG. 3J shows the deposited semiconductor material 118 during an initial stage of the deposition process. During the initial deposition stage, the deposited semiconductor material 118 has a first surface 118a and a second surface 118b. Without being bound by theory, it is believed that the first surface 118a of the semiconductor material 118 is formed along the c-plane with a Millar index of (0001) because the first or second sidewall 108a and 108b of the epitaxial silicon structures 108 has the Si(1,1,1) crystal orientation. It is also believed that the second surface 118b of the semiconductor material 118 can have a semi-polar or non-polar crystal orientation. For example, in the illustrated embodiment, the second surface 118b has a semi-polar crystal orientation with a Millar index of (1$\bar{1}$01). In other examples, the second surface 118b can have other suitable semi-polar or non-polar crystal orientations by adjusting a deposition temperature, a deposition duration, a deposition precursor composition, and/or other suitable operating parameters.

FIG. 3K shows another state of the deposited semiconductor material 118 during a later stage of the deposition process. As shown in FIG. 3K, the deposited semiconductor material 118 has a semiconductor surface 120 that extends away from the substrate material 102. Without being bound by theory, it is believed that the semiconductor surface 120 has the same crystal orientation as the second surface 118b (FIG. 3J) of the semiconductor material 118. In the illustrated embodiment, the semiconductor surface 120 is generally planar and parallel to the substrate surface 103 of the substrate material 102. In other embodiments, the semiconductor surface 120 may form a slanted angle with respect to the substrate surface 103 of the substrate material 102. Subsequently, the process can include depositing InGaN, GaN/InGaN MQWs, P-type GaN, and/or other suitable semiconductor materials to form cladding structures, active regions, and/or other suitable components of an LED, LD, and/or other suitable types of SSL devices.

SSL devices (e.g., LEDs) produced according to several embodiments of the process discussed above can have increased optical efficiency when compared to conventional devices. For example, the GaN/InGaN MQW 16 of the LED 10 in FIG. 1 is typically grown along the c-axis (FIG. 2A). Without being bound by theory, it is believed that the GaN/InGaN materials grown along the c-axis are polarized with an induced internal electric field generally perpendicular to the direction of growth. It is also believed that the internal electric field can slant the energy bands of the active region and can spatially prevent some of the electrons in the N-type GaN material 14 (FIG. 1) from recombining with holes in the P-type GaN material 18 (FIG. 1) during operation. The low recombination rate can result in a low optical efficiency of the LED 10. As a result, by forming the semiconductor material 118 on a semi-polar or non-polar plane, the induced internal electric field can be reduced. Thus, the recombination rate in the SSL device may be increased to improve the optical efficiency.

Several embodiments of the process discussed above can also have lower manufacturing costs when compared to conventional techniques. According to conventional techniques, the GaN/InGaN materials 14, 16 and 18 (FIG. 1) are typically grown on silicon wafers with the Si(1,1,1) crystal orientation. Such silicon wafers can be expensive to produce because conventional techniques typically yield the Si(1,0,0) crystal orientation. As a result, several embodiments of the process discussed above can have lower manufacturing costs because the substrate material 102 can include a silicon wafer with the Si(1,0,0) crystal orientation, but provide the advantages normally associated with Silicon wafers having a Si(1,1,1) crystal structure.

Even though particular operations are discussed above for exposing at least a portion of the first or second sidewalls 108a and 108b of the epitaxial silicon structures 108, in certain embodiments other techniques can also be used in addition to or in lieu of the operations discussed above. For example, FIGS. 4A-4C show another technique for exposing the first or second sidewalls 108a and 108b of the epitaxial silicon structures 108.

Figure 4A:
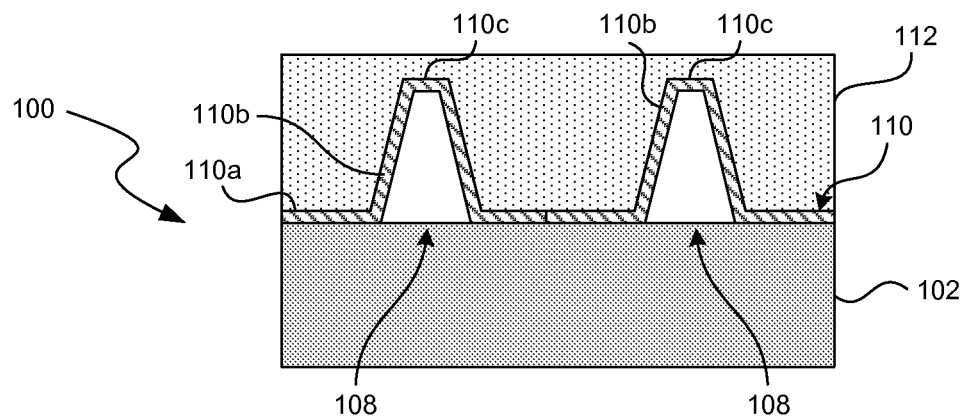
FIGS. 4A-4C are cross-sectional views of a portion of a microelectronic substrate undergoing a process of forming another SSL device in accordance with embodiments of the technology.
Figure 4B:
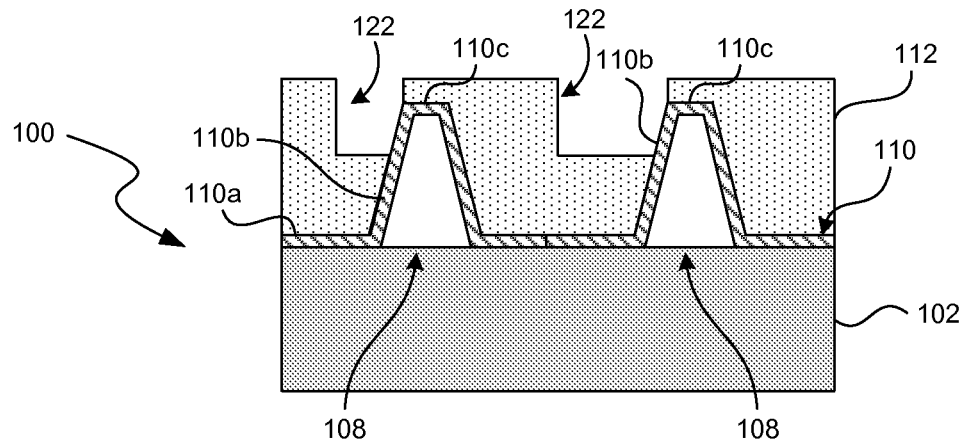
Figure 4C:
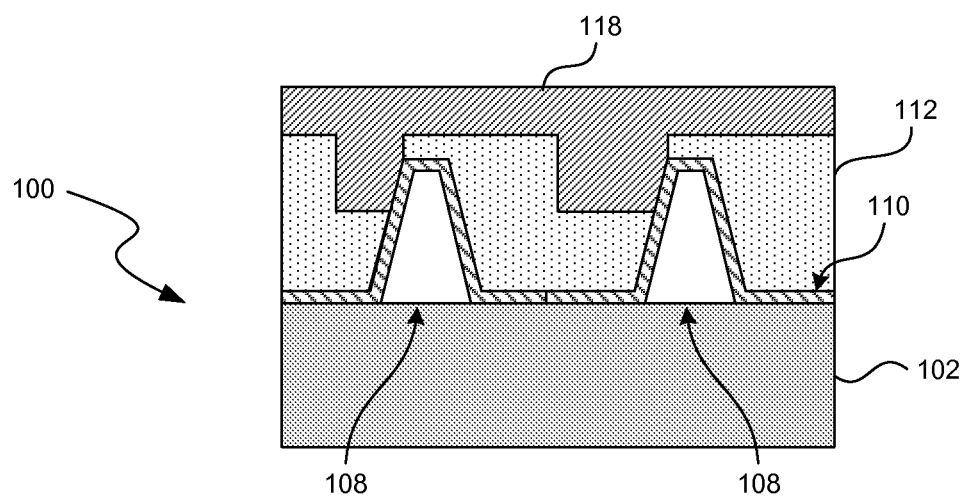

As shown in FIG. 4A, a stage of the process can include depositing the insulating material 112 onto the substrate material 102. The deposited insulating material 112 substantially encapsulates the buffer material 110 and the epitaxial silicon structures 108. As shown in FIG. 4B, a subsequent stage of the process can include removing a portion of the insulating material 112 to form a plurality of third openings 122 in the insulating material 112. The third openings 122 expose at least a part of the second portion 110b of the optional buffer material 110. During the removal operation, the insulating material 112 can be patterned such that the third portion 110c of the optional buffer material 110 is not exposed after the portion of the insulating material 112 is removed. As shown in FIG. 4C, the semiconductor material 118 can then be deposited onto the microelectronic substrate 100 as discussed above with reference to FIGS. 3J and 3K.

Figure 5A:
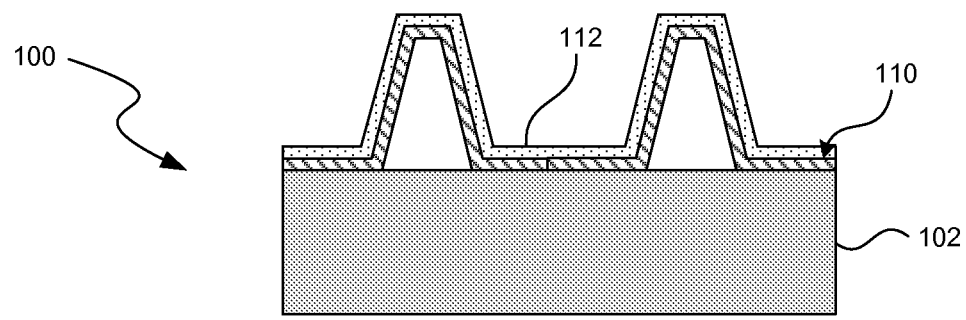
FIGS. 5A-5C are cross-sectional views of a portion of yet another microelectronic substrate undergoing a process of forming an SSL device in accordance with embodiments of the technology.
Figure 5B:
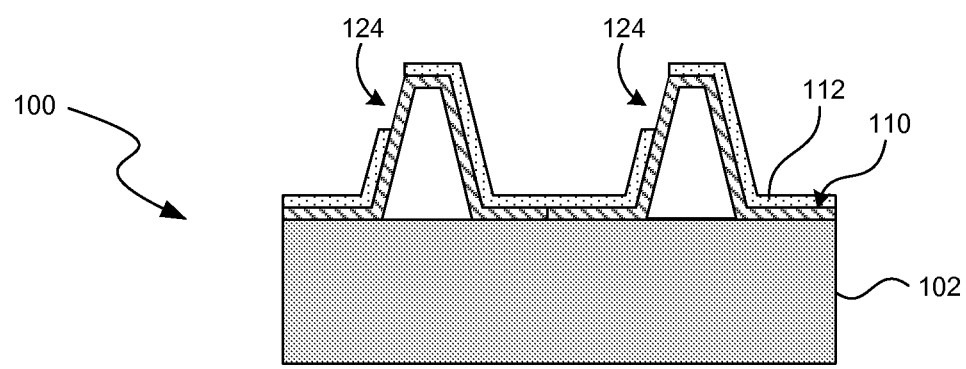
Figure 5C:
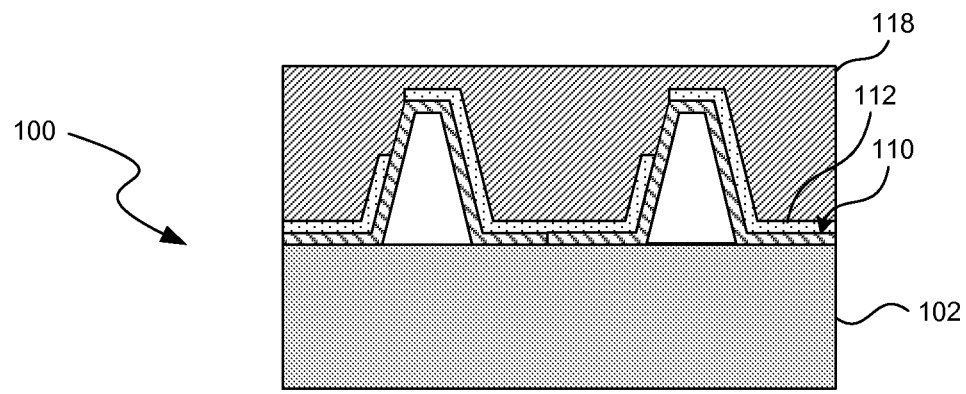

Even though the insulating material 112 is shown in FIGS. 3A-4C as having a generally planar surface spaced apart from the substrate material 102, in certain embodiments, the insulating material 112 can also conform generally to the substrate material 102 and/or the epitaxial silicon structures 108, as shown in FIG. 5A. A portion of the generally conformal insulating material 112 can be removed to form a plurality of fourth openings 124 in the insulating material 112 (FIG. 5B). The fourth openings 124 expose at least a part of the second portion 110b of the optional buffer material 110, as described above with reference to FIG. 4B. As shown in FIG. 5C, the semiconductor material 118 can then be deposited onto the microelectronic substrate 100 as discussed above with reference to FIGS. 3J and 3K.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

I claim:

1. A light emitting diode, comprising:
 a substrate material having a substrate surface;
 an epitaxial silicon structure in direct contact with the substrate surface of the substrate material, the epitaxial silicon structure having a top wall spaced apart from the substrate surface of the substrate material and a sidewall extending between the substrate surface and the top wall; and
 a semiconductor material over at least a portion of the sidewall of the epitaxial silicon structure, the semiconductor material having a semiconductor surface spaced apart from the substrate surface, the semiconductor surface forming an angle of greater than 0° but less than 90° with respect to the sidewall of the epitaxial silicon structure.

2. The light emitting diode of claim 1 wherein:
 the substrate material includes a silicon wafer having a Si(1,0,0) crystal orientation;
 the top wall of the epitaxial silicon structure has a Si(1,0,0) crystal orientation;
 the sidewall of the epitaxial silicon structure has a Si(1,1,1) crystal orientation;
 the semiconductor material includes at least one of an N-type GaN material, a P-type GaN material, and GaN/InGaN multiple quantum wells;
 the semiconductor surface has a Miller index of $(1\bar{1}01)$ and is generally parallel to the substrate surface; and
 the light emitting diode further includes:
  a buffer material between the semiconductor material and the epitaxial silicon structure, a portion of the buffer material being on the sidewall of the epitaxial silicon structure, and the buffer material including at least one of aluminum nitride (AlN), aluminum-gallium nitride (AlGaN), and zinc nitride (ZnN);
  an insulating material between the semiconductor material and the buffer material, the insulating material partially encapsulating the buffer material with at least a part of the portion of the buffer material on the sidewall of the epitaxial silicon structure exposed to the semiconductor material; and
  a barrier material on the top wall of the epitaxial silicon structure, the barrier material being encapsulated by the semiconductor material.

3. The light emitting diode of claim 1 wherein:
 the top wall of the epitaxial silicon structure has a Si(1,0,0) crystal orientation; and
 the sidewall of the epitaxial silicon structure has a Si(1,1,1) crystal orientation.

4. The light emitting diode of claim 1 wherein:
 the top wall of the epitaxial silicon structure has a Si(1,0,0) crystal orientation;
 the sidewall of the epitaxial silicon structure has a Si(1,1,1) crystal orientation; and
 the semiconductor material is on a portion of the sidewall of the epitaxial silicon structure having the Si(1,1,1) crystal orientation.

5. The light emitting diode of claim 1 wherein:
 the top wall of the epitaxial silicon structure has a Si(1,0,0) crystal orientation;
 the sidewall of the epitaxial silicon structure has a Si(1,1,1) crystal orientation;
 the semiconductor material is on a portion of the sidewall of the epitaxial silicon structure having the Si(1,1,1) crystal orientation; and
 the semiconductor surface of the semiconductor material has a crystal orientation with a Miller index of $(1\bar{1}01)$.

6. The light emitting diode of claim 1 wherein:
 the top wall of the epitaxial silicon structure has a Si(1,0,0) crystal orientation;
 the sidewall of the epitaxial silicon structure has a Si(1,1,1) crystal orientation;
 the semiconductor material is on a portion of the sidewall of the epitaxial silicon structure having the Si(1,1,1) crystal orientation; and
 the semiconductor surface of the semiconductor material is generally parallel to the substrate surface of the substrate material.

7. The light emitting diode of claim 1 wherein:
 the top wall of the epitaxial silicon structure has a Si(1,0,0) crystal orientation;
 the sidewall of the epitaxial silicon structure has a Si(1,1,1) crystal orientation;
 the light emitting diode further includes a buffer material between the semiconductor material and the epitaxial silicon structure, a portion of the buffer material being on the sidewall of the epitaxial silicon structure, and the buffer material including at least one of aluminum nitride (AlN), aluminum-gallium nitride (AlGaN), and zinc nitride (ZnN);
 the semiconductor material is in direct contact with the portion of the buffer material on the sidewall of the epitaxial silicon structure; and
 the semiconductor surface of the semiconductor material is generally parallel to the substrate surface of the substrate material.

8. A light emitting diode, comprising:
 a substrate material having a substrate surface;
 an epitaxial silicon structure in direct contact with the substrate surface, the epitaxial silicon structure having a sidewall extending away from the substrate surface; and
 a semiconductor material on at least a portion of the sidewall of the epitaxial silicon structure, the semiconductor material having a semiconductor surface spaced apart from the substrate surface, the semiconductor surface being at a semi-polar or non-polar crystal plane of the semiconductor material.

9. The light emitting diode of claim 8 wherein the semiconductor material is not in direct contact with the substrate surface of the substrate material.

10. The light emitting diode of claim 8, further comprising an insulating material between the substrate surface and the semiconductor material.

11. The light emitting diode of claim 8 wherein:
the light emitting diode further includes an insulating material between the substrate surface and the semiconductor material;
the sidewall of the epitaxial silicon structure has a Si(1,1,1) crystal orientation;
the sidewall of the epitaxial silicon structure forms an angle of less than 90° with respect to the substrate surface; and
at least a portion of the sidewall of the epitaxial silicon structure is exposed to the semiconductor material via the insulating material.

12. The light emitting diode of claim 8 wherein:
the light emitting diode further includes an insulating material between the substrate surface and the semiconductor material;
the light emitting diode further includes a buffer material between the semiconductor material and the epitaxial silicon structure, the buffer material including at least one of aluminum nitride (AlN), aluminum-gallium nitride (AlGaN), and zinc nitride (ZnN);
the buffer material includes a first portion on the substrate surface and a second portion on the sidewall of the epitaxial silicon structure; and
the insulating material insulates the first portion of the buffer material from the semiconductor material.

13. The light emitting diode of claim 8 wherein:
the light emitting diode further includes an insulating material between the substrate surface and the semiconductor material;
the sidewall of the epitaxial silicon structure has a Si(1,1,1) crystal orientation;
the epitaxial silicon structure further includes a top wall spaced apart from the substrate surface;
the light emitting diode further includes a buffer material between the semiconductor material and the epitaxial silicon structure, the buffer material including at least one of aluminum nitride (AlN), aluminum-gallium nitride (AlGaN), and zinc nitride (ZnN);
the buffer material includes a first portion on the substrate surface, a second portion on the sidewall of the epitaxial silicon structure, and a third portion on the top wall of the epitaxial silicon structure; and
the insulating material insulates the first portion and the third portion of the buffer material from the semiconductor material.

14. The light emitting diode of claim 8 wherein:
the light emitting diode further includes an insulating material between the substrate surface and the semiconductor material;
the sidewall of the epitaxial silicon structure has a Si(1,1,1) crystal orientation;
the epitaxial silicon structure further includes a top wall spaced apart from the substrate surface;
the light emitting diode further includes a buffer material between the semiconductor material and the epitaxial silicon structure, the buffer material including at least one of aluminum nitride (AlN), aluminum-gallium nitride (AlGaN), and zinc nitride (ZnN);
the buffer material includes a first portion on the substrate surface, a second portion on the sidewall of the epitaxial silicon structure, and a third portion on the top wall of the epitaxial silicon structure; and
the insulating material insulates the first portion, the third portion, and a part of the second portion of the buffer material from the semiconductor material.

15. The light emitting diode of claim 8 wherein:
the light emitting diode further includes an insulating material between the substrate surface and the semiconductor material;
the sidewall of the epitaxial silicon structure has a Si(1,1,1) crystal orientation;
the epitaxial silicon structure further includes a top wall spaced apart from the substrate surface;
the light emitting diode further includes a buffer material between the semiconductor material and the epitaxial silicon structure, the buffer material including at least one of aluminum nitride (AlN), aluminum-gallium nitride (AlGaN), and zinc nitride (ZnN);
the buffer material includes a first portion on the substrate surface, a second portion on the sidewall of the epitaxial silicon structure, and a third portion on the top wall of the epitaxial silicon structure;
the insulating material insulates the first portion and a part of the second portion of the buffer material from the semiconductor material; and
the light emitting diode further includes a barrier material between the semiconductor material and the top wall, the barrier material insulating the top wall from the semiconductor material.

* * * * *